United States Patent [19]
Milstein

[11] 4,087,313
[45] May 2, 1978

[54] PROCESS AND APPARATUS FOR PREPARATION OF SINGLE CRYSTALS AND TEXTURED POLYCRYSTALS

[76] Inventor: Joseph Beril Milstein, 12109 Greenleaf Ave., Potomac, Md. 20854

[21] Appl. No.: 635,421

[22] Filed: Nov. 28, 1975

[51] Int. Cl.² .............................................. B01J 17/18
[52] U.S. Cl. .............................. 156/602; 156/617 SP
[58] Field of Search .......................... 156/602, 617 SP; 250/424, 425; 423/21, 263

[56] References Cited

U.S. PATENT DOCUMENTS

| | | | |
|---|---|---|---|
| 2,999,737 | 9/1961 | Siebertz | 156/602 |
| 3,160,497 | 12/1964 | Loung | 156/602 |
| 3,314,769 | 4/1967 | Rudness | 156/602 |
| 3,437,432 | 4/1969 | Borchardt | 423/263 |
| 3,625,660 | 12/1971 | Reed | 156/602 |
| 3,729,306 | 4/1973 | Henrie | 156/602 |

FOREIGN PATENT DOCUMENTS

| | | | |
|---|---|---|---|
| 649,727 | 10/1962 | Canada | 156/617 SP |
| 629,412 | 10/1961 | Canada | 156/167 SP |

OTHER PUBLICATIONS

Single Crystal Growth of $HoFe_2$ and $ErFe_2$ – Milstein, Magnetism and Magnetic Material, 1975, American Institute of Physics.

Spin Moves in the Cubic Ferrimagnet $Ho_{.88}Tb_{0.12}Fe_2$ Milstein, Physical Review Letters, vol. 36, No. 10, Mar. 8, 1976.

*Primary Examiner*—Hiram H. Bernstein

[57] ABSTRACT

A molten region is formed in a solid material disposed on a cooled hearth capable of rotation. The solid material acts as a crucible for the melt, and single crystals or textured polycrystals may be grown from the molten region, with simultaneous rotation of the hearth and contained solid. The melt is formed in the solid material by one or more electric arcs struck between the material which may behave as an anode, and one or more cathodes which are directed toward the material, so that the electron and plasma flow from the cathodes to the material, produces and maintains the melt.

2 Claims, 2 Drawing Figures

PROCESS AND APPARATUS FOR PREPARATION OF SINGLE CRYSTALS AND TEXTURED POLYCRYSTALS

BACKGROUND OF THE INVENTION

The invention relates generally to methods and means of growing crystals, and more particularly to methods and means of growing crystals of intermetallic compounds having as one of their components a metal selected from the group consisting of the lanthanide rare earth elements, and yttrium (hereinafter referred to as "intermetallic compounds of rare earth metals"), or alloys of said compounds, one with the other.

In the field of crystal growth, the need for improved control of chemical purity, homogeneity and crystallographic perfection have long been recognized. For example, single crystals of such well-known semiconductor materials as silicon and germanium which do not possess sufficient degrees of chemical purity, homogeneity or crystallographic perfection cannot be fabricated into useful devices. References hereinafter to crystallographic quality or the use of terms of description of relative crystallographic quality are to be understood in the sense used in the fields of X-ray or neutron diffraction.

Some of the most important problems in growing a crystal having desirable degrees of chemical purity, homogenity and crystallographic perfection from a molten mass relate to the ease, accuracy and reproducibility of the control of the melt temperature, and of the uniformity of temperature in the region of the melt where crystal growth occurs.

A number of additional problems relate with particularity to the instance where the melt and the crystal to be grown contain a metal selected from the group consisting of the lanthanide rare earth elements, and yttrium. Some of the problems encountered are:

the chemical reactivity of the melt, which is manifested by attack of the melt upon virtually any material used as a crucible which is allowed to approach the temperature of the melt, and by contamination of the melt upon contact with the elements oxygen, nitrogen, hydrogen or carbon, among others;

the tenacious nature of the dross which frequently appears on the surface of such melts, with the consequence that random nucleation of second grains may be effected; in addition, the dross is more thermally emissive and has higher surface tension than the molten metal, which leads to unwanted variations in temperature in those locations where dross is found, with associated uncontrolled variations in the quality of the crystals grown;

the dearth of reliable data as to the phase relations, melting points and other thermodynamic characteristics of intermetallic compounds of rare earth metals, there frequently being several publications on a given material stating mutually contradictory findings or results;

the observation of anomalous thermal expansion effects in some of the intermetallic compounds of rare earth metals, with the consequences that crystallographic damage can result to growing or grown crystals which are physically constrained in a container while the temperature is changed, thus introducing stresses or strains, and that the random nucleation of second grains at the interface between the growing crystal and the melt may result when a constraint is present at the interface;

the intermetallic compounds of rare earth metals are also frequently brittle when in polycrystalline form at room temperature, and prone to shattering violently when heated abruptly;

and, the intermetallic compounds of rare earth metals are readily contaminated by exposure to oxygen, even at room temperature, when in forms having large surface to volume ratios, for example, powders or granules.

The prior art consists of a number of methods which have been employed with varying success for the provision of single crystals of intermetallic compounds wherein at least one constituent is a lanthanide rare earth metal. Also to be found in the prior art are methods which have been employed to provide for the preparation of crystals in an electric arc powdered crystal growing apparatus. These methods include:

directionally freezing a melt contained in crucibles constructed from materials such as tantalum, aluminum oxide and boron nitride, the crucibles being held at the same temperature as the contained material;

the horizontal floating zone technique;

crystal pulling from a melt contained in a crucible maintained at the temperature of the melt;

the thermal imaging growth technique;

the method and means described by Loung in U.S. Pat. No. 3,160,497, for pulling ingots of refractory metals;

the method and means described by Reed et al in U.S. Pat. No. 3,625,660 for growing crystals of semiconductors;

and the method and means described by Rudness et al in U.S. Pat. No. 3,314,769, for growing crystals of metals.

Each of these methods, while yielding crystals of varying quality, suffers from one or more of the problems enumerated above, as will be presently outlined. The present invention overcomes each of the problems, as will become apparent hereinafter.

The method of directional freezing suffers from the problems of melt contamination, stresses and strain induced in the crystals, and nucleation of second grains. In extreme cases, the crucible has been known to fail entirely.

The horizontal floating zone technique suffers from the problems of stresses and strains induced in the grown crystal, and nucleation of second grains.

The method of crystal pulling from a melt contained in a crucible maintained at the temperature of the melt suffers from the problems of attack by the melt on the crucible and melt contamination. The thermal imaging growth technique, although novel, suffers from the problem of temperature control, in that any material which might volatilize from the melt can coat the transparent envelope through which power is optically conveyed to the melt, thus resulting in changes of power at the melt which an operator may not be able to control. In an extreme case, the transparent envelope may be rendered opaque by deposits of such volatile material, halting operation by this method completely.

The method and means of Loung and of Reed et al make no reference whatever to the provision of a method or means for physically rotating the solid portion of the material which is intended to be melted with respect to the heat source. The method and means of Rudness et al suffers from the problem that powders of the intermetallic compounds of rare earth metals are oxidized by only traces of oxygen, so that this embodiment of their method and means would probably fail to provide acceptable crystals. In the embodiment wherein a solid feed rod is melted, the brittleness of the starting polycrystalline materials might lead to failure of the method. Furthermore, the technique of Rudness, et al, specifically does not allow for the independent rotation of the growing boule and the molten region from which it grows, thus not permitting to occur that mixing or stirring action which may be obtained by this means. Lastly, this technique demands that the crystal is the only solid area where the dross which frequently is present might collect, which would seriously damage the quality of the material grown.

Thus, the patented prior art referred to suffers from problems related to temperature control and homogeneity. As will be made apparent hereinafter, these problems are overcome by the present invention.

SUMMARY

The general purpose of this invention is to provide an improved method of and apparatus for preparation of single crystals and textured polycrystals of intermetallic compounds wherein at least one constituent is a metal selected from the group consisting of the lanthanide rare earth elements, and yttrium, or of the alloys of said compounds one with the other, which has all the advantages of similarly employed methods and has none of the above described disadvantages. To attain this, the present invention provides a unique method of and novel means for rotation of the solid portion of the material being melted in the crystal growing apparatus, whereby the control of temperature and the uniformity of temperature obtained in the region of the melt from which the crystal is grown are improved, and dross is removed from the said region.

An object of the instant invention is to provide method and apparatus by which single crystals of intermetallic compounds, wherein at least one constituent is a metal selected from the group consisting of the lanthanide rare earth elements, and yttrium, or of the alloys of said compounds one with the other, may be prepared.

A textured polycrystal may be defined as a solid body composed of a plurality of crystalline grains, a preponderance of which have a given crystallographic axis present in each aligned along a common direction. The utility of such a structure has been demonstrated, for example, in the preparation of permanent magnets from powders.

Thus, another object of the invention is to provide method and apparatus by which textured polycrystals of intermetallic compounds, wherein at least one constituent is a metal selected from the group consisting of the lanthanide rare earth elements and yttrium, or of the alloys of said compounds one with the other, may be prepared.

A still further object of the invention is to provide method and apparatus by which single crystals of intermetallic compounds, wherein at least one constituent is a metal selected from the group consisting of the lanthanide rare earth elements and yttrium, or of the alloys of said compounds one with the other, having a mosaic spread of not more than three tenths of a degree as measured by standard X-ray or neutron diffraction techniques, may be prepared.

Yet another object of the invention is to provide an electric arc powered Czochralski-type crystal growing apparatus, in which the melt may be rotated relative to the electric arcs, to maintain the surface of the melt dross-free and to maintain uniform temperature in the region of the melt from which crystals are grown.

In accordance with features of the present invention, a charge of solid material, held in a cooled metal hearth, serves as an anode and a plurality of cathodes are disposed above this material and energized so that an arc or arcs are struck between one or more of the cathodes and the material, the arc or arcs being of sufficient intensity to melt a portion of the material to form a molten region contained by solid material. Means are provided to rotate the hearth, which contacts a graphite bearing. The graphite bearing in turn contacts a cooled anode body of the crystal growing apparatus, and serves to conduct electrical current and heat from the hearth to the anode body, as well as providing a housing for the hearth and a means of location of low friction such that it may be rotated. The rotation of the hearth and the solid portion of the charge resting upon it relative to the positions of the one or more active cathodes results in a dross-free melt having a more uniform temperature distribution, in greater ease of temperature control, in greater ease of crystal growth, and in more homogeneous and crystallographically better crystals, which are grown from the molten region, employing the well-known Czochralski crystal pulling technique.

In a particular embodiment described herein, six such cathodes are employed. Means are also provided for injecting a purging gas into the apparatus to provide a suitable medium for the arcs and to prevent contamination of the melt.

Examples of the invention include an electrically conductive anode assembly having a rotatable hearth for containing the anode charge of selected material, a cathode assembly containing a plurality of moveable cathode probes disposed around a crystal pulling rod connected to means of rotation and motion toward and away from the melt and holding at its lower end a seed crystal or polycrystalline ingot for pulling crystals from the melt. The cathode body is supported above the anode body by a transparent cylinder which may be glass, and which seals to each body and permits viewing the process of crystal growth. The purging gas is introduced through the anode body and exits through the cathode body.

BRIEF DESCRIPTION OF THE DRAWING

Other objects and many of the attendant advantages of this invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
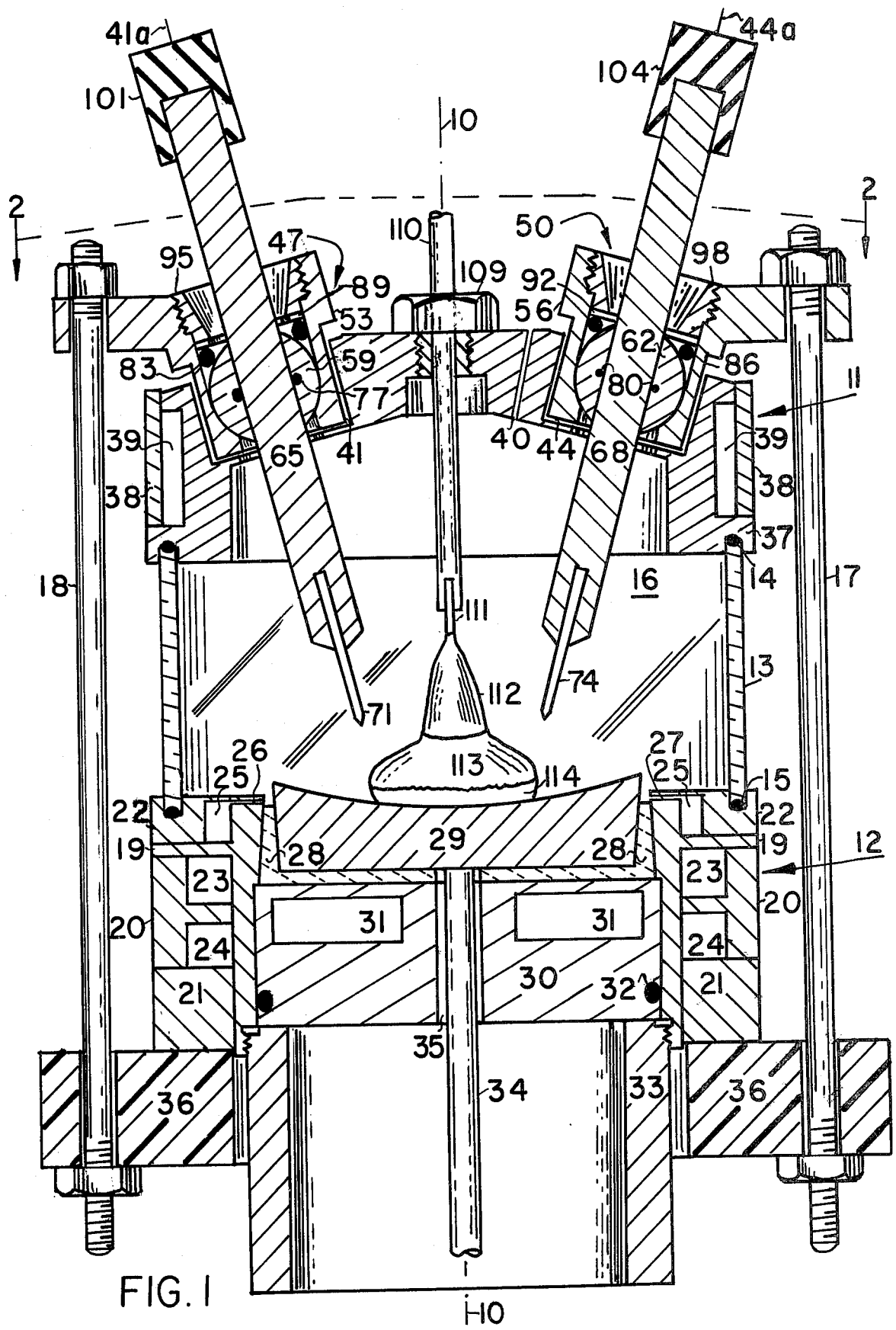
FIG. 1 is a cross-section view taken through the axis of an electric arc powered Czochralski-type crystal growing apparatus incorporation features of the invention.

The prior art most closely related to the present invention is that described in U.S. Pat. No. 3,625,660, filed on Mar. 18, 1968 by Thomas B. Reed and Edward R. Pollard for Method and Structure for Growing Crystals, which is hereby incorporated by reference. Much of what is described hereinafter is similar to that described in U.S. Pat. No. 3,625,660, with the specific improvement of the present embodiment being a rotatable copper hearth, a graphite bearing, a connecting shaft, and means for rotation, and the related modification in the method of employment of the apparatus. As will be shown hereinafter, the improvements contemplated in the present invention appreciably alter the mode of operation of the apparatus, rendering it capable of a use found beyond its scope prior to the instant invention.

The present invention contemplates method and apparatus for growing single crystals and textured polycrystals of intermetallic compounds having as one of their constituents a metal selected from the group consisting of the lanthanide rare earth metals and yttrium, or of alloys of said compounds one with the other, from a melt. This is accomplished by arc heating solid material, which may be in polycrystalline form. Crystals and textured polycrystals are grown by pulling from the melt. The arcs are controlled in such a way that only a portion of the material melts and is contained by the rest of the material, so that the container for the melt is the solid material itself, and will not contaminate the melt in any manner.

The charge of material is heated by a number of arcs that are struck between the material which functions as as anode and a plurality of cathodes, arranged around the center of this anode, so that the electron and plasma flow from each active cathode to the anode heats the material sufficiently to form a melt. The crystals are grown from the center of the melt in the typical fashion, known as the Czochralski technique. Textured polycrystals are grown in a similar manner, employing a faster pulling rate and/or different starting compositions than are used for growing the corresponding single crystals.

The mechanism for pulling the crystals may consist of a seed crystal or polycrystalline ingot, which is moveable toward and away from the melt, substantially along the major axis of the apparatus, and which is capable of rotation independent of the rotation of the melt, and independent of said motion toward and away from the melt. An inert gas, which may be highly purified argon, may be played over the melt to purge the area around the melt of impurities and to provide a medium for the arcs.

This method of growing crystals and textured polycrystals from a melt is conveniently performed employing six cathodes which are preferably moveable, elongated electrically conductive bodies positioned just above the anode material and then energized so that arcs are struck between some or all of the cathodes and the anode material. These arcs are of sufficient intensity to melt a portion of the material so that the melt is contained in a pool at the center of the material. The cooled rotatable hearth upon which the material rests may then be rotated relative to the positions of the arcs, sequentially heating all portions of the molten material, which serves to remove any dross which may appear on the surface of the melt from the region of crystal growth in the approximate center of the melt. In addition, the molten portion of the material is maintained uniform in temperature and composition throughout, as the rotation also serves to stir the melt, and thus averaging out any inhomogeneities in temperature and composition. The rotation rates employed vary in the ranges of 40 to 90 revolutions per minute for the hearth, and 0 to 40 revolutions per minute for the pulling mechanism, depending on the material used. The pulling mechanism and the hearth may rotate in the same sense or in opposite senses. When the melt is maintained uniform and dross-free, crystals of uniform quality may be pulled or grown from the melt.

Figure 2:
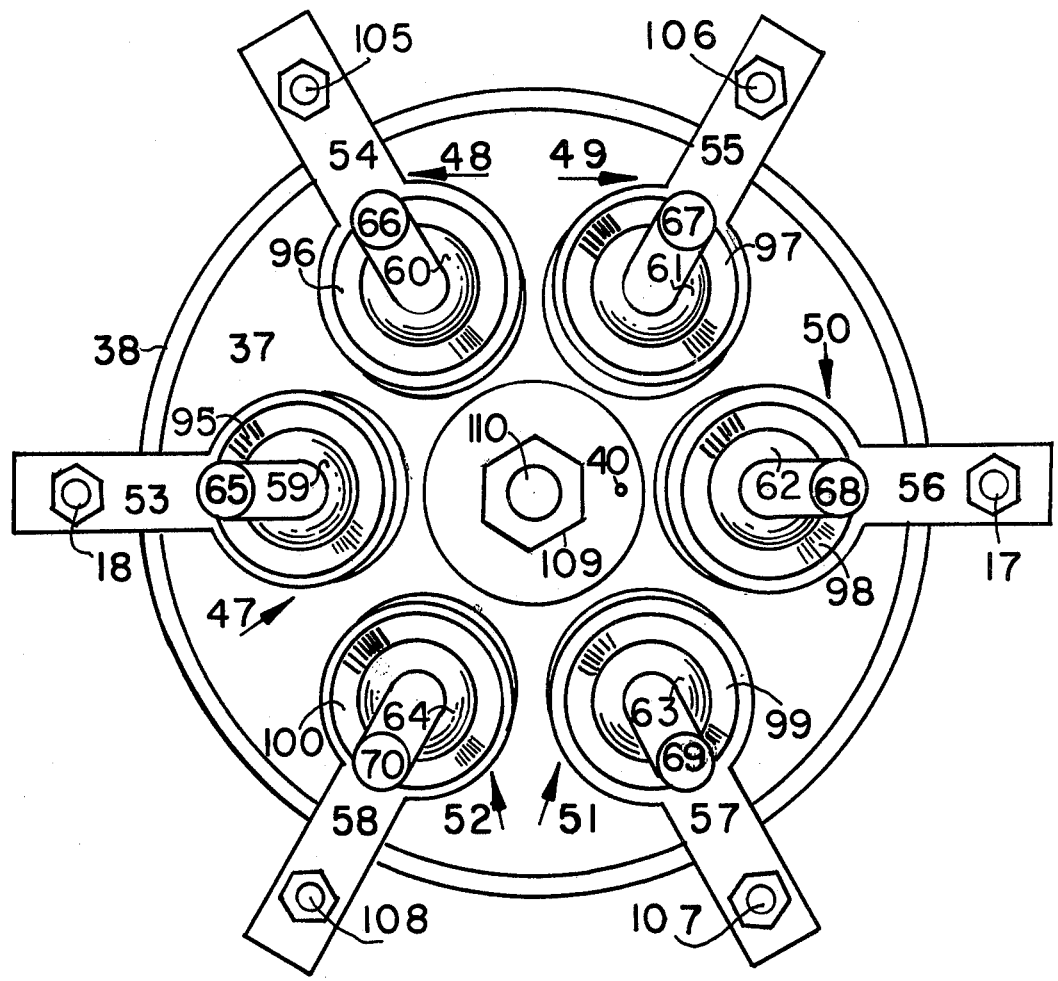
FIG. 2 is a top-sectional view of the apparatus illustrating the arrangement of cathode electrodes in the cathode body taken as shown in FIG. 1.

FIGS. 1 and 2 included herewith describe suitable apparatus for practicing the persent invention. An alternative apparatus having only three cathodes is not shown, but may be understood by deleting three of the cathodes of the present embodiment, as is described in the disclosure of Reed, et al. This apparatus is called herein an electric arc powered Czochralski-type crystal growing apparatus, by which single crystals and textured polycrystals are pulled in a vertical direction from a melt. FIG. 1 is a cross-section view of the apparatus, the section being taken through the major axis 10 of the apparatus. As will be seen from the description which follows, many of the parts of this apparatus are figures of revolution about the axis 10, and it will be quite obvious from the description which parts are figures of revolution and which are not. Unless otherwise stated, it will be understood that all seals described may be rubber "O" rings and all other parts of the apparatus may be made of nonporous commercial brass.

As shown in FIG. 1, the cathode assembly 11 is of generally cylindrical shape and is disposed on the axis 10. The anode assembly 12 is also of generally cylindrical shape, disposed below the cathode assembly 11 and connected thereto to support the cathode assembly 11 by a transparent cylinder 13, preferably made of glass. The glass cylinder 13 seals to the cathode assembly 11 and the anode assembly 12 by seals 14 and 15, respectively, which are held in grooves contained in registry in the cathode assembly 11 and anode assembly 12. The crystal growth cavity 16 is defined as the volume enclosed by the cathode assembly 11, the anode assembly 12 and the glass cylinder 13. Bolts, such as 17 and 18, securely hold the glass cylinder 13 against the seals 14 and 15 as will be made clear hereinafter.

The anode assembly 12 consists of an anode body 19, a first lower ring 20, a second lower ring 21, and an upper ring 22, which, when assembled as shown and soldered or welded together, define a number of annular voids, which are the first coolant chamber 23, the second coolant chamber 24, and the purge gas conveyance chamber 25. Two apertures 26 and 27 are contained in anode body 19, which allow gas to communicate between purge gas conveyance chamber 25 and crystal growth cavity 16. Anode body 19 is further seen to contain a doubly tapered graphite bearing 28, which in turn contains a rotatable tapered copper hearth 29, whose upper surface is a spherical section, that it may safely contain material. The tapers shown serve to provide good electrical and thermal contact between the hearth 29 and the graphite bearing 28, and again between the bearing 28 and the anode body 19. A support plate 30, which contains a third annular coolant chamber 31, supports graphite bearing 28, and is sealed to anode body 19 by a seal 32, which is held in a compressed state in a groove contained in plate 30. Retainer ring 33 holds plate 30 in place and threadedly connects to body 19.

Rotation of hearth 29 is accomplished by shaft 34, which is connected at its upper end to hearth 29, and which extends through a bore 35, contained in the graphite bearing 28 and support plate 30, which may be made close fitting to shaft 34, and through ring 33 to connect at its lower end to means for providing reversible, variable speed rotational motion, which is not shown. Thus, hearth 29 may be caused to rotate in a horizontal plane. Cooling chambers 23, 24 and 31 independently communicate with means for delivering and withdrawing cooling fluid, each by means of two apertures, which are not shown, so that anode assembly 12 may be cooled. Purge gas conveyance chamber 25 communicates with a means of supply of inert gas by means of an aperture in upper ring 22, which is not shown. Anode assembly 12 rests upon insulating support plate 36, which is preferably plexiglass, and through which pass ring 33, shaft 34 and six bolts, of which only bolts 17 and 18 are shown in FIG. 1.

Cathode assembly 11 consists of cathode block 37, to which a cylindrical ring 38 is assembled and soldered or welded, thus defining a fourth annular coolant chamber 39 which is provided with coolant fluid by means of supply and withdrawal not shown, via two apertures in ring 38 which are not shown, in order to cool cathode assembly 11. An aperture 40 contained in cathode block 37 allows purge gas to escape the apparatus after passing through crystal growth cavity 16. Means for conveying the escaping purge gas to a suitable exhaust may be provided, and is not shown. Cathode block 37 further contains six apertures, 41 to 46, of which only two, 41 and 44, are shown. These apertures, 41 to 46, are disposed along axes 41a to 46a, of which only 41a and 44a are shown, which are disposed about the major axis 10 in a regular array, the axes 41a to 46a lying in a common right circular cone defined about axis 10, as will be understood upon comparing FIG. 1 with FIG. 2, which is a top-sectional view of the apparatus, taken as shown in FIG. 1.

Each aperture, 41 to 46, contains one complete cathode electrode assembly 47 to 52, respectively; only assemblies 47 and 50 are shown in FIG. 1. Since the cathode electrode assemblies 47 to 50 are all identical, the details only of assembly 47 will be described herein.

Socket 53 enters aperture 41 and is fastened therein with an insulating medium (not shown), which is preferably high temperature epoxy cement, thereby being electrically isolated from cathode block 37 and from the other sockets 54 to 58. Pivot ball 59, preferably made of aluminum bronze, rests in socket 53 and holds copper cathode electrode holder 65 in a bore frictionally, which in turn holds cathode electrode 71. The electrode 71 is preferably an elongated, sharp-pointed body of thoriated tungsten. The seal 77 is held in a groove contained in ball 59, and is pressed between cathode electrode holder 65 passing through ball 59 and the interior suface of the bore in ball 59 itself. It will be understood upon examining FIG. 2 that cathode electrode holder 65 is cylindrical and passes through the center of ball 59. Returning to FIG. 1, seal 83 rests against ball 59 and the interior wall of socket 53 and is compressed by pressure ring 89 which in turn is held in place by retainer ring 95, which threadably screws into socket 53. The interior surface of ring 95 is a conical section, which is designed to allow cathode electrode holder 65 sufficient room to move perpendicular to its long axis. This motion is accomplished in unison with ball 59, which is capable of rotation about three mutually perpendicular axes, and which will maintain a given disposition as a result of the frictional forces applied to it by the compressed seal 83. It should also be understood that cathode electrode holder 65 can move through ball 59 in such a manner as to dispose cathode electrode 71 relatively nearer to or farther from the upper surface of hearth 29, as the operator may wish. The end of cathode electrode holder 65 which projects from the apparatus is connected to an insulating handle 101, preferably made of epoxy-filled fiberglass or the like, by which means the operator may change the disposition of cathode electrode holder 65 and thereby cathode electrode 71 during operation of the apparatus.

By considering FIG. 2, and with the understanding that all of the cathode electrode assemblies 47 to 52 are identical in every feature of their construction and operation, it will be recognized that assemblies 48 to 52 respectively consist of one each of the following component parts, the parts being distributed among the assemblies in serial order: sockets 54 to 58, pivot balls 60 to 64, cathode electrode holders 66 to 70, cathode electrodes 72 to 76 (not shown), seals 78 to 82 (not shown), seals 84 to 88 (not shown), pressure rings 90 to 94 (not shown), retainer rings 96 to 100 and handles 102 to 106 (not shown). Thus, as may be seen in FIG. 1, assembly 50 consists of socket 56, pivot ball 62, cathode electrode holder 68, cathode electrode 74, seal 80, seal 86, pressure ring 92, retainer ring 98, and handle 104.

Further comparing FIGS. 1 and 2, it is clear that bolts 17 and 18, as well as bolts 105 to 108, pass through plate 36 at their lower ends and through apertures in the tails of sockets 53 to 58, being made fast at each end, thus holding cathode assembly 11 and cathode assembly 12 securely against glass cylinder 13 and its seals 14 and 15.

Cathode body 37 contains an aperture about axis 10, wherein gland 109 is threadedly connected. Gland 109 may contain a seal, which is not shown, and which may preferably be made of teflon, which is pressed against pull rod 110 which passes through the bore of gland 109 and the aperture of block 37 into which gland 109 is screwed. Pull rod 110 is connected at its upper end to means for reversible, variable speed axial rotation (not shown), and independently, to means for providing vertical displacement (not shown), and at its lower end contains a groove into which a seed crystal 111, or alternatively a polycrystalline ingot, may be placed and secured.

The electrical circuits in the apparatus may be understood by observing that means for providing a DC voltage (not shown) to each cathode independently may be fixed to the apparatus, whereby anode assembly 12 may be held at ground potential and the bolts 17, 18, and 105 to 108, at negative potentials. The electrical path through each cathode assembly 47 to 52 will be seen to be identical, the path in only assembly 47 being given in detail herein. Electrical communication is effected to cathode electrode 71 via cathode holder 65, then via pivot ball 59, then via socket 53, then via bolt 18 to one side of said means for providing voltage; from the other side thereof is connected to anode assembly 12, and graphite bearing 28 provides an electrically conductive path between anode body 19 and copper hearth 29. When the means for providing the voltage is energized, an arc is produced between the cathode electrode 71 and the material placed on the hearth 29.

The collective function of all the seals enumerated hereinbefore will be recognized as preventing air from the outside of the apparatus entering therein and contaminating the material to be melted.

In operation, while cooling fluid is caused to circulate through each of the coolant chambers 23, 24, 31 and 39, and while inert gas is caused to flow through the apparatus as described above, a charge of material having been placed on hearth 29, the anode assembly 12 and cathode electrodes 71 to 76, are electrically energized so that arcs strike from each of the cathode electrodes to the anode charge. These arcs are of sufficient intensity to melt a portion of the anode charge which is contained within a solid portion of said charge. The rotation of hearth 29 is begun, as described before. Finally, the seed crystal 111 may be touched to the molten portion of the charge and withdrawn, growing single crystal 112 from molten region 113 of the melt, which is contained by solid material 114, as shown in FIG. 1. Alternatively, a textured polycrystal may be grown.

The novel method and apparatus for growing single crystals and textured polycystals described herein is exemplified by the structures described. In particular, when the single crystals or textured polycrystals grown are of intermetallic compounds one constituent of which is a metal selected from the group consisting of the lanthanide rare earth elements and yttrium, or of alloys of said compounds one with the other, the method and apparatus described herein avoids the disadvantages of other methods and means previously used.

Some examples are presented which demonstrate the efficacy of the method and apparatus described herein over those used previously, with regard to the compounds enumerated above.

No fewer than fourteen attempts to grow crystals of intermetallic compounds containing holmium and terbium, using an electric arc powered Czochralski-type crystal growing apparatus having a non-rotatable hearth resulted only in polycrystalline specimens, while the first such attempt thereafter, in which a rotatable copper hearth 29 was employed, with the associated graphite bearing 28, shaft 34 and means for providing rotation, resulted in a single crystal. The second attempt made using the method and apparatus described herein resulted in the first single crystal consisting of holmium, terbium and iron ever to have been demonstrated by neutron diffraction method to have a mosaic spread of three tenths of a degree or less. Subsequent attempts have resulted in other single crystals having different compositions, and equal crystallographic quality. The present method and apparatus has provided the only single crystals of intermetallic compounds having a first element R and a second element T wherein R is a metal selected from the group consisting of the lanthanide rare earth metals and yttrium, and T is a metal selected from the group consisting of iron, cobalt and nickel, or alloys of said compounds, having mosaic spread of not greater than three tenths of a degree, measured by standard neutron diffraction methods. Furthermore, the method and apparatus disclosed herein can be employed to provide textured polycrystals of intermetallic compounds at least one constituent of which is a metal selected from the group consisting of the lanthanide rare earth elements and yttrium.

Obviously many modifications and variations of the present invention are possible in light of the above teachings. It is therefore to be understood that, within the scope of the appended claims, the invention may be practiced otherwise than as specifically described.

What is claimed is:

1. In a method of growing crystals of intermetallic compounds having a first element R and a second element T, wherein R is a metal selected from the group consisting of the lanthanide rare earth metals and yttrium, and T is a metal selected from the group consisting of iron, cobalt and nickel, or alloys of said compounds, having mosaic spread of not more than three tenths of a degree, measured by standard neutron diffraction methods, of the type wherein:

material is placed in an electrically conductive hearth, the material is then partially melted by the action of a plurality of electric arcs and plasma associated with each such arc to produce a molten region contained by the solid portion of said material, and then growing a crystal by controlled withdrawal of material from the molten region, wherein the improvement comprises:

causing the solid portion of said material to be physically rotated relative to the said electric arcs in a manner such that the action of the arcs removes dross from the surface of the molten region, during the crystal growth process.

2. In a method of growing textured polycrystals of intermetallic compounds having a first element R and a second element T, wherein R is a metal selected from the group consisting of the rare earth metals and yttrium, and T is a metal selected from the group consisting of iron, cobalt and nickel, or alloys of said compounds, of the type wherein:

material is placed in an electrically conductive hearth, the material is then partially melted by the action of a plurality of electric arcs and plasma associated with each such arc to produce a molten region contained by the solid portion of said material, and then growing a textured polycrystal by controlled with drawal of material from the molten region, wherein the improvement comprises:

causing the solid portion of said material to be physically rotated relative to the said electric arcs in a manner such that the action of the arcs removes dross from the surface of the molten region, during the growth process.

* * * * *